United States Patent [19]
Bertin et al.

[11] Patent Number: 6,060,746
[45] Date of Patent: May 9, 2000

[54] POWER TRANSISTOR HAVING VERTICAL FETS AND METHOD FOR MAKING SAME

[75] Inventors: Claude L. Bertin, South Burlington, Vt.; Jeffrey P. Gambino, Gaylordsville, Conn.; Jack A. Mandelman, Stormville, N.Y.

[73] Assignee: International Business Machines Corporation, Armonk, N.Y.

[21] Appl. No.: 08/798,663

[22] Filed: Feb. 11, 1997

[51] Int. Cl.[7] .............................. H01L 29/76; H01L 29/78
[52] U.S. Cl. .......................... 257/331; 257/334; 257/401
[58] Field of Search ................................. 257/329, 330, 257/331, 332, 333, 334, 401, 133, 134

[56] References Cited

U.S. PATENT DOCUMENTS

| | | | |
|---|---|---|---|
| 5,208,172 | 5/1993 | Fitch et al. | 437/40 |
| 5,293,053 | 3/1994 | Malhi et al. | 257/330 |
| 5,489,787 | 2/1996 | Amaratunga et al. | 257/137 |
| 5,504,359 | 4/1996 | Rodder | 257/329 |
| 5,581,100 | 12/1996 | Ajit | 257/331 |

*Primary Examiner*—Donald Monin
*Attorney, Agent, or Firm*—Whitham, Curtis & Whitham; Eugene I. Shkurko, Esq.

[57] ABSTRACT

A power transistor having of a plurality of vertical MOSFET devices combined in parallel to achieve high-performance operation and methods of fabricating this device.

20 Claims, 12 Drawing Sheets

POWER TRANSISTOR HAVING VERTICAL FETS AND METHOD FOR MAKING SAME

BACKGROUND OF THE INVENTION

1. Field of the Invention

The invention relates to a power transistor and methods for its fabrication.

2. Description of the Related Art

High-performance power amplifiers and switching devices require low on-resistance, i.e., low resistance during conduction of current by the device, to limit internal power dissipation at high levels of operating current. For low voltage power supply applications, ultra-low on-resistance is essential. Furthermore, inter-electrode capacitance, lead inductance and carrier transit time limit the maximum frequency of operation. Additionally, power devices must efficiently dissipate internally generated heat. With the expanding market for high power communications amplifiers and switching applications (e.g., automotive, mechanical control), there is an increased need for high-performance, low-voltage, inexpensive, solid-state power devices.

Conventional power MOSFETs used in these devices and applications employ planar transistors. Geometries and channel length control required for achieving the desired objectives have been difficult to attain in conventional silicon devices using such planar transistors. A planar transistor has a diffused source electrode and a drain electrode separated by a channel region. A gate electrode overlies the channel region. A gate oxide dielectric separates the channel region from the overlying gate electrode. The planar transistors have relatively large surface area requirements and have developed operational problems in sub-micron integrated circuit geometries, such as leakage currents, isolation, and hot carrier injection.

SUMMARY OF THE INVENTION

It is an object of the present invention to provide a a power transistor structure endowed with a high packing density of transistors.

It is another object of the present invention to fabricate a power MOSFET structure displaying improved gate control, lower resistance, lower inductance, improved heat dissipation, capability for fully depleted operation, and lower inter-electrode capacitance.

It is yet another object of the present invention to provide a method of forming vertical transistors having sub-lithographic dimension.

These and other objects, advantages, and benefits are achieved in the present invention providing a power transistor comprised of a plurality of vertical MOSFET devices combined in parallel to achieve high-performance operation.

The terminology "power transistor", as used herein, means a plurality of individual transistors of the same conductivity type that are formed on a common substrate, where the source electrodes each share a common conductive connection layer and the drain electrodes of the transistors also each share a common conductive connection layer. The resulting device is a power device that is essentially a plurality of transistors connected in parallel that function as a single power transistor endowed with high current carrying capacity.

In the present invention, the power transistor has a multipillar configuration in which each vertical MOSFET is formed in a small diameter pillar of doped semiconductor material overlying the substrate and the vertical transistors have short very well controlled channel lengths. Due to the small radius of curvature of the pillars, each vertical MOSFET device exhibits steeper turn-on characteristics than the best conventional planar transistor devices, for comparable channel doping and gate oxide thickness. It also is possible in the present invention to minimize the diameter of the device pillar to provide improved gate control, which allows short channel operation without drain-source punch-through.

The present invention also provides vertical transistors embodied by pillars having a diameter which is less than the minimum dimension definable by lithography (i.e., smaller than minimum image size on a mask). Thus, the mask image does not define the diameter of the pillars in the present invention. This attribute allows for greater gate control, allowing for improved short-channel effects, shorter channels and lower on-resistance. Moreover, the very narrow diameter pillar makes fully depleted operation possible. Fully depleted operation mode is desirable as it provides enhanced gate control (i.e., near ideal sub-$V_t$ slope) and allows operation at even shorter channels.

Additionally, in a preferred embodiment, a continuous N+ bottom layer is provided that electrically connects multiple pillars to each other, such that the N+ bottom layer serves as a drain for the power transistor. This feature results in reduced drain resistance as compared to multiple drain diffusions in a P substrate.

Additionally, the parallel configuration of multiple small-diameter vertical MOSFETs in the present invention provides better gate control for more aggressive channel scaling. The inventive device also provides a superior degree of gate control over the geometry of conventional planar devices. Additionally, backside thinning and large area metallurgy provides lower resistance and inductance and improved heat dissipation capability. The MOSFET structure fabricated by the inventive method also provides for low inter-electrode capacitance.

The present invention also provides gate conductors that are strapped with a common metal layer, which provides lower gate resistance and reduced gate propagation delays, and has enhanced flexibility in terms of the choice of gate conductor materials that can be used.

In the inventive method, the channel length of the transistors is controlled by film thickness deposition and diffusion processes. The manner used to define the channel length allows improved channel length control when compared with the conventional lithographic methods used for planar transistor devices. The inventive MOSFETs can have a channel length tolerance of approximately ±10% or better. For a 0.18 µm nominal channel length, conventional planar FET devices have, at best, a channel length tolerance of ±0.05 µm at comparable minimum dimensions. The improved channel length tolerance that can be realized in the present invention allows for a shorter nominal channel length with resulting benefits in performance. Backside thinning and metallization is applied to the inventive FET structure during fabrication, resulting in greatly reduced on-resistance compared to the prior art. Reduced on-resistance makes operation with low voltage feasible. The geometry of the inventive device allows low inter-electrode capacitance to be attained. Large area metallization in the present invention for the source and drain electrodes results in low series inductance, low resistance and superior heat dissipation capability.

These and other objects and features of the invention will become more fully apparent from the several drawings and description of the preferred embodiments.

BRIEF DESCRIPTION OF THE DRAWINGS

FIG. 11, in particular, illustrates a cross-sectional view taken in the direction indicated in FIG. 10, at the completion of fabrication.

Figure 1:
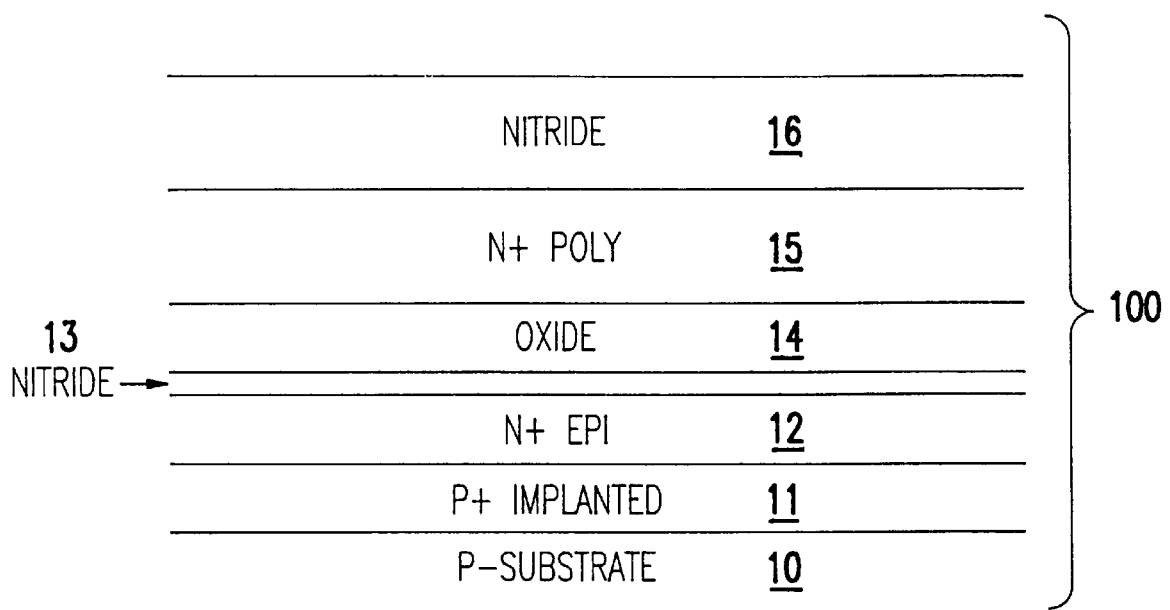
FIGS. 1 through 9 and 11 illustrate enlarged, cross-sectional view of a power transistor structure at various stages of fabrication as made in accordance with the teachings of the present invention.

It will be understood that the drawings are not necessarily to scale, as the thicknesses of the various layers are shown for visual clarity and should not be interpreted in a limiting sense unless otherwise indicated herein.

DETAILED DESCRIPTION OF THE PREFERRED EMBODIMENTS OF THE INVENTION

Referring now to the drawings, there is shown a representative portion of a power transistor structure made according to the method of the present invention in enlarged views at several stages of the fabrication scheme.

Referring to FIG. 1, a structure suitable for starting preparation of a power transistor 100 is depicted including a substrate 10, which has surface and a first conductivity type. As exemplified, the substrate 10 is a <100> P-type single crystal silicon wafer 10.

A heavily doped P+ layer 11 is formed across the surface of wafer 10 by implanting boron ions in the surface of the wafer 10. For example, borons ions can be implanted at a peak concentration of greater than $10^{20}$ ions cm$^{-3}$ ($10^{15}$ to $10^{16}$ cm$^{-2}$) at 10–100 keV. This P+ layer 11 will serve as an an etch stop layer during a later described step of thinning the backside of the transistor structure under fabrication.

An N+ layer 12 is then epitaxially grown on the surface of P+ layer 11. Conventional vapor-phase epitaxy (VPE) techniques can be used, such as involving reactants of silane or chlorosilanes, e.g., $SiCl_4$, $SiHCl_3$, or $SiH_2Cl_2$. This N+ layer 12 provides for outdiffusion to form the drain junction of the completed MOSFET device. Arsenic or phosphorus doping may be used in forming N+ layer 12, depending on desired outdiffusion consistent with the thermal budget and junction grading needs. The impurity doping can be done in-situ during epitaxial growth using appropriate dopant gases, such as arsine or phosphine, as will be understood in the field. Alternatively, ion implantation can be used to form the N+ layer 12.

A very thin nitride layer 13, e.g., approximately 5 nm thick, is then deposited on N+ layer 12. Conventional CVD techniques used to form silicon nitride films can be employed, such as LPCVD and PECVD. This nitride layer 13 will be used as an wet etch stop selective to oxide and polysilicon in later processing. As known in the field, $Si_3N_4$ is an excellent, non-hygroscopic barrier to alkali ion migration, and is used as a cover layer in MOS technology for this reason.

An oxide layer 14 is then deposited on nitride layer 13. Conventional techniques can be used to form oxide layer 14, such as pyrolytic oxidation of TEOS in APCVD or LPCVD systems, or oxidation of silane in APCVD or LPCVD systems. The thickness of the oxide layer 14 is well controlled and is consistent with the amount of subsequent N+ out-diffusion required to provide channel continuity without excessive drain-gate overlap. With this constraint in mind, a useful thickness for oxide layer 14 generally can be about 50 nm. The oxide layer 14 will provide insulation between the drain and gate for reduction of capacitance.

A layer 15 of N+ doped polysilicon (polycrystalline silicon) or amorphous silicon is deposited on oxide layer 14. Conventional CVD techniques used to form polysilicon films, such as LPCVD, can be used to form a polysilicon or amorphous silicon layer 15. Although preferably polysilicon or amorphous silicon, layer 15 also can be made of a metal, a salicide or silicide, and the like. Layer 15 will serve as the gate conductor, i.e., the control electrode, in the completed device, and the vertical thickness of the layer 15 will determine the gate length. The gate length, based on the vertical thickness of layer 15, generally can be 0.18 µm or less. This is possible because state of the art CVD deposition technology allows thickness control to better than ±10%. It is also possible to use other materials, such as P+ polysilicon as layer 15, to achieve the desired gate conductor work function.

A thicker upper nitride layer 16 is deposited. Conventional CVD techniques used to form silicon nitride films can be employed, such as LPCVD and PECVD. A generally useful thickness for layer 16 can be 150 nm.

Figure 2:
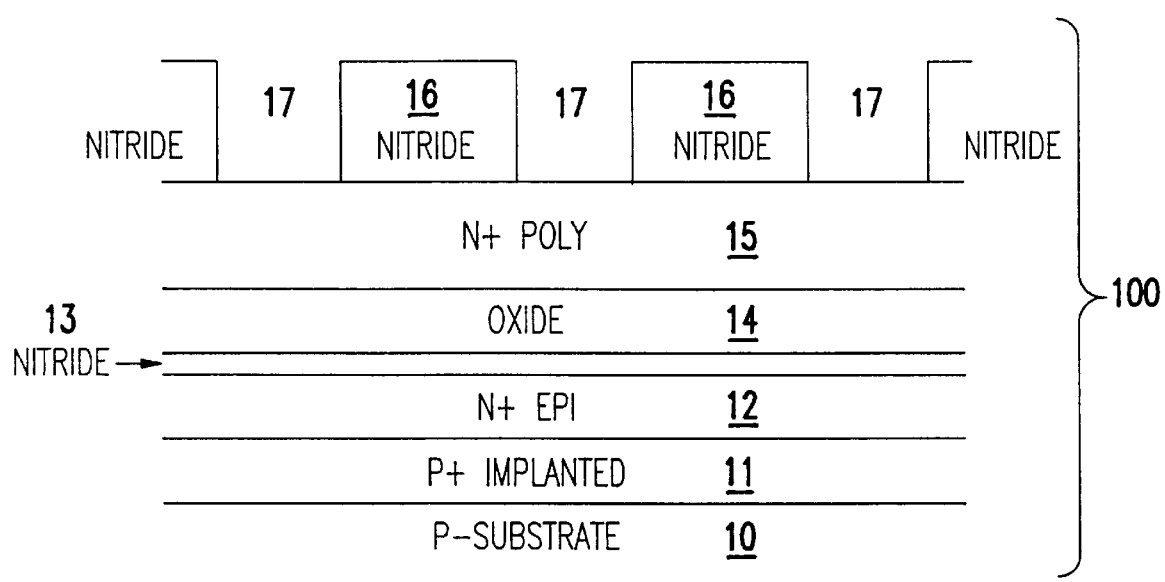

Openings 17 are then patterned in and through the upper nitride layer 16, such as by reactive ion etching with a fluorine based chemistry such as $CF_4/CHF_3/Ar/O_2$ using a mask (not shown) which is then removed, resulting in a structure as depicted in FIG. 2.

Figure 3A:
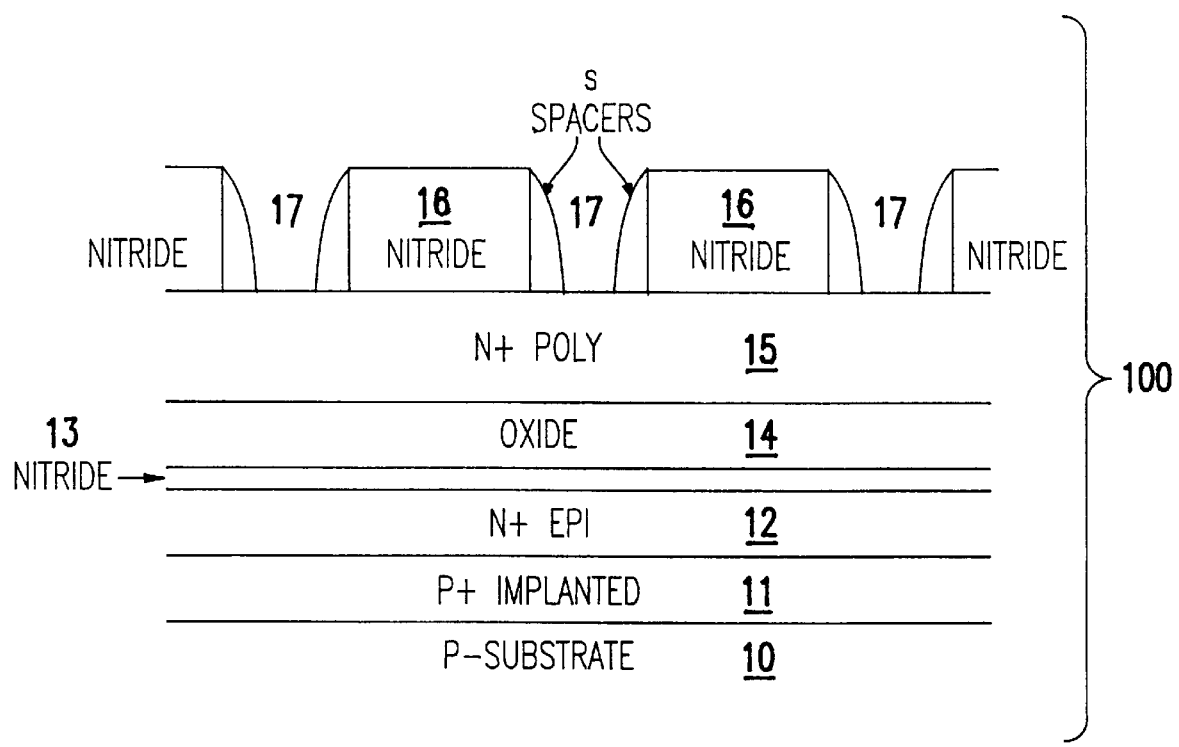

If formation of sub-lithographic dimension devices is desirable or required, it is possible at this juncture in the process to form spacers "s" on the sidewalls of the patterned nitride layer 16 to effectively reduce the width dimension of openings 17, as shown in FIG. 3A. The spacers "s" can be nitride spacers formed in a conventional manner by depositing an LPCVD nitride layer, followed by an anisotropic etch. This optional step of forming spacers "s" allows for formation of sub-lithographic minimum diameter conductive pillars, which pillars are described in greater detail hereinafter.

Figure 3B:
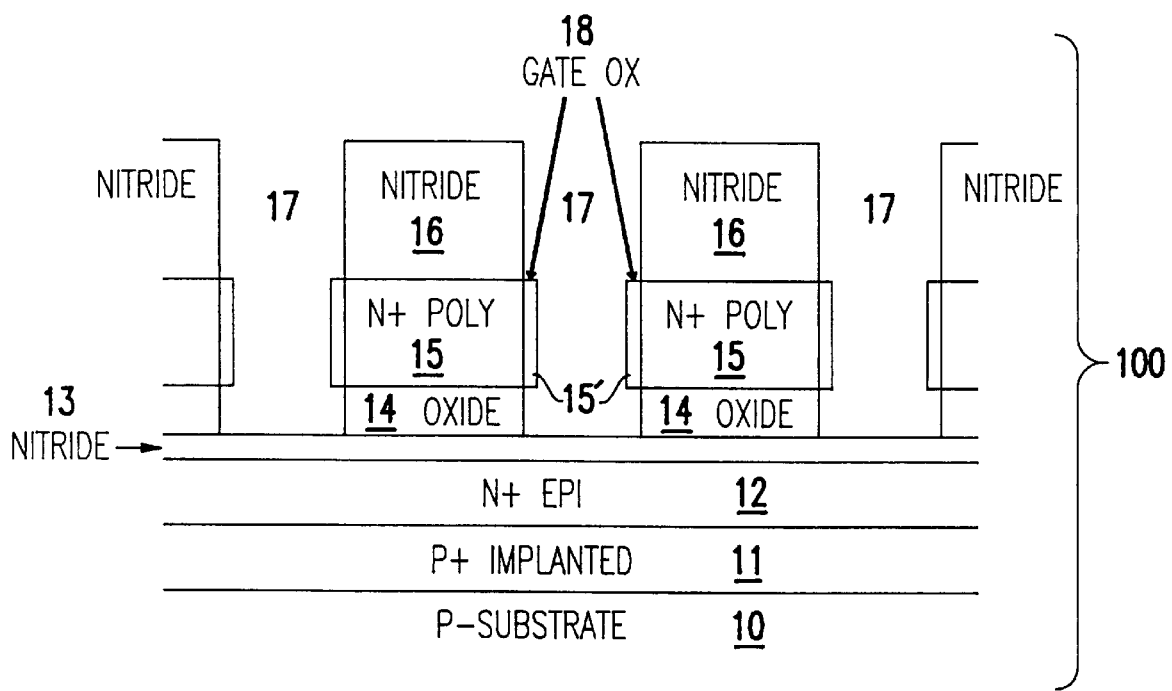

After patterning openings 17 through nitride layer 16 and providing any optional spacers "s", then the exposed portions of N+ polysilicon layer 15 are then anisotropically etched with an etchant, such as a HBr or a chlorine based dry etch, which is selective to nitride, down to oxide layer 14. The pattern of openings 17 is then further transferred into oxide layer 14 with an etchant, such as $C_4F_8/CO/Ar$ RIE or $C_2F_6$ RIE, which is selective to nitride and silicon, stopping on the thin lower nitride layer 13. Then as shown in FIG. 3B, a thin gate oxide 18 is then selectively grown from the exposed side wall surfaces 15' of the polysilicon layer 15 within opening 17. Alternatively, the gate insulator may be formed by deposition and reactive ion etching of an insulating film. Gate oxide 18 is a dielectric material, such as silicon dioxide, and forms laterally adjacent the sidewall surfaces 15' of the polysilicon layer 15. The gate oxide can be grown by thermal oxidation by exposure of polysilicon layer 15 to elevated temperature in an oxidizing environment, such as dry oxygen or water vapor. The thermal oxidation operation should be conducted sufficient to provide a gate oxide thickness of about 30–200 Å, preferably about 50 Å. The patterned polysilicon layer 15 will be the gate conductors of the vertical FET's.

The thin nitride layer 13 at the bottom of the openings 17 is removed by chemical dry etching, which is non-directional to minimize damage to the gate oxide 18 and to expose surface regions 12' of N+ epi layer 12.

P-type silicon is epitaxially grown upward from the exposed surface regions 12' of N+ epi layer 12 filling openings 17 until it achieves a vertical dimension that is higher than the upper surface of the upper nitride layer 16. The P epi is then polished back, such as by CMP, to be even with the surface of the nitride layer 16 to form silicon pillars 19 formed of P epitaxial silicon. The pillars 19 are formed of silicon, or other semiconductor material, doped with ionic impurities preferably as introduced in-situ during the epitaxial growth procedure, or, alternatively, as introduced in a subsequent procedure using diffusion and/or implantation techniques. Techniques for in-situ doping during growth of silicon are known involving use of dopant gas sources, such as a boron containing gas if the conductivity type sought is P type. The conductivity of pillars 19 can be opposite to that of polysilicon layer 15 used as the gate conductor or, alternatively, the same type but of different concentration.

Figure 4:
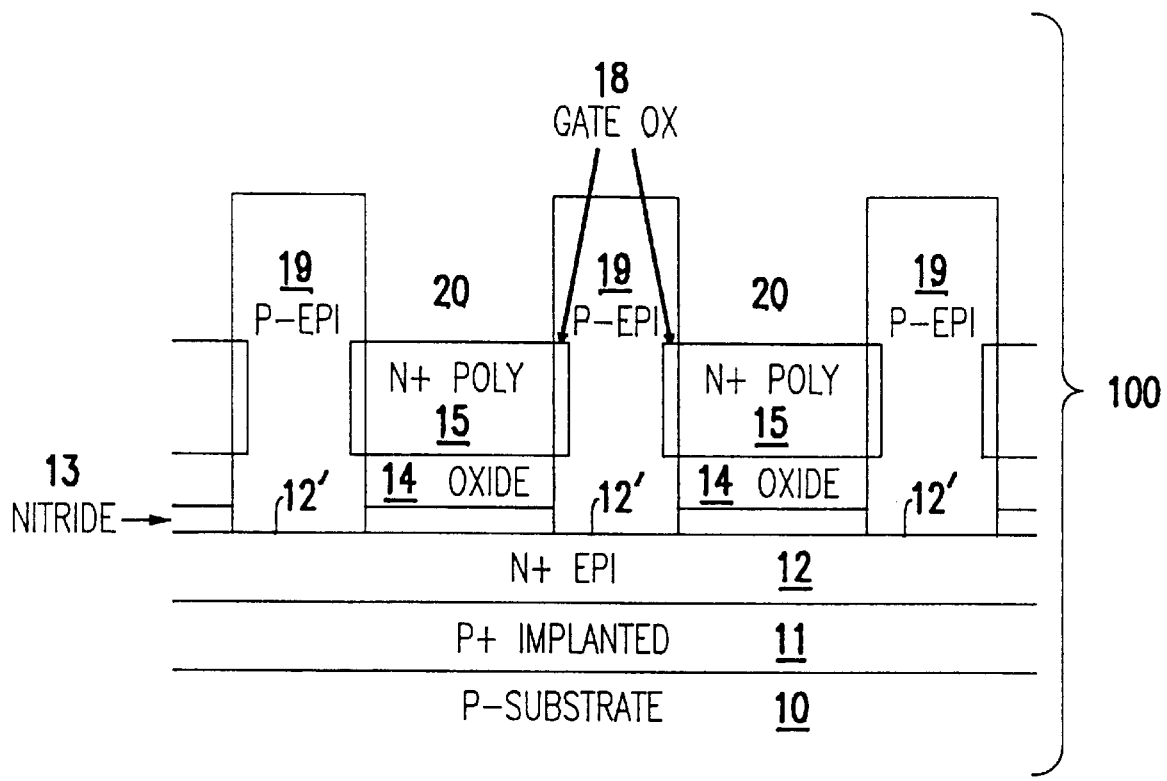

Once the pillars 19 are formed, the upper nitride layer 16, and any optional spacers "s", are then etched out using an etchant that is selective to silicon, such as hot $H_3PO_4$ acid, resulting in an intermediate structure shown in FIG. 4 having holes 20 where the nitride layer 16 previously was present.

Figure 5:
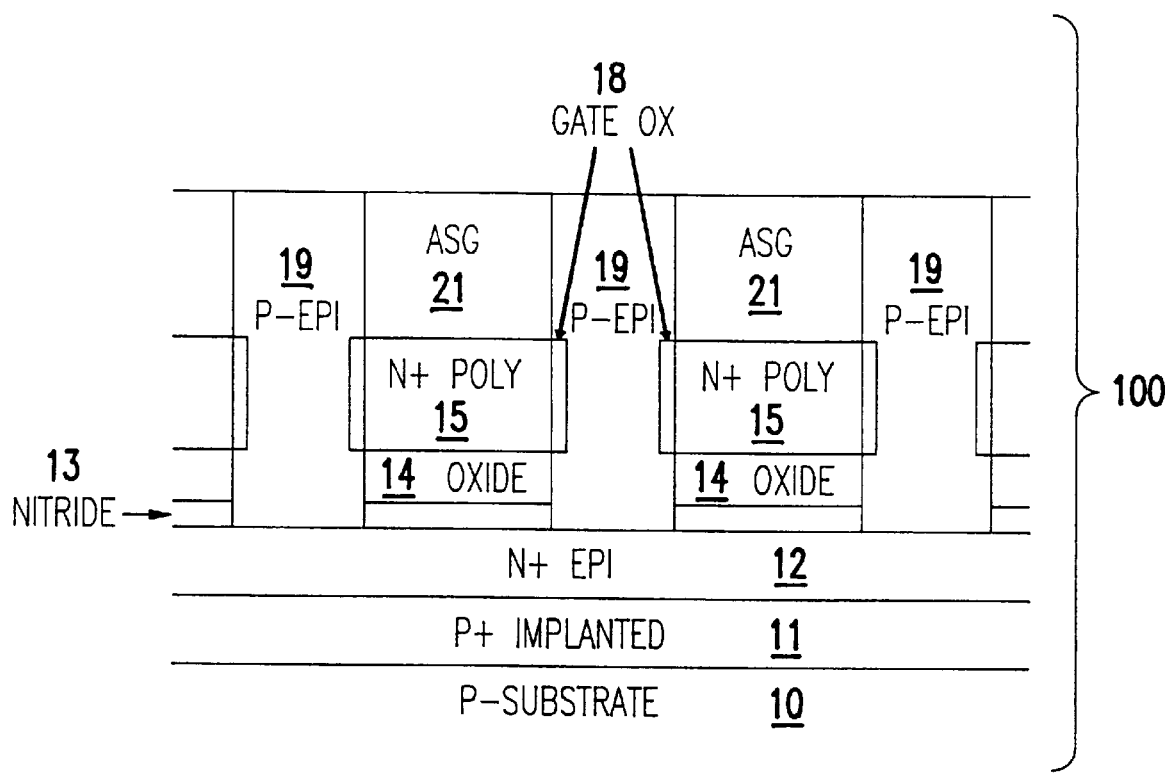

Arsenic-doped silicate glass (ASG) 21 is deposited such that it fills holes 20. Excess portions of the ASG deposited on the surfaces of silicon pillars 19 are removed by planarization from the top of the pillars 19, resulting in the intermediate configuration shown in FIG. 5.

Figure 6:
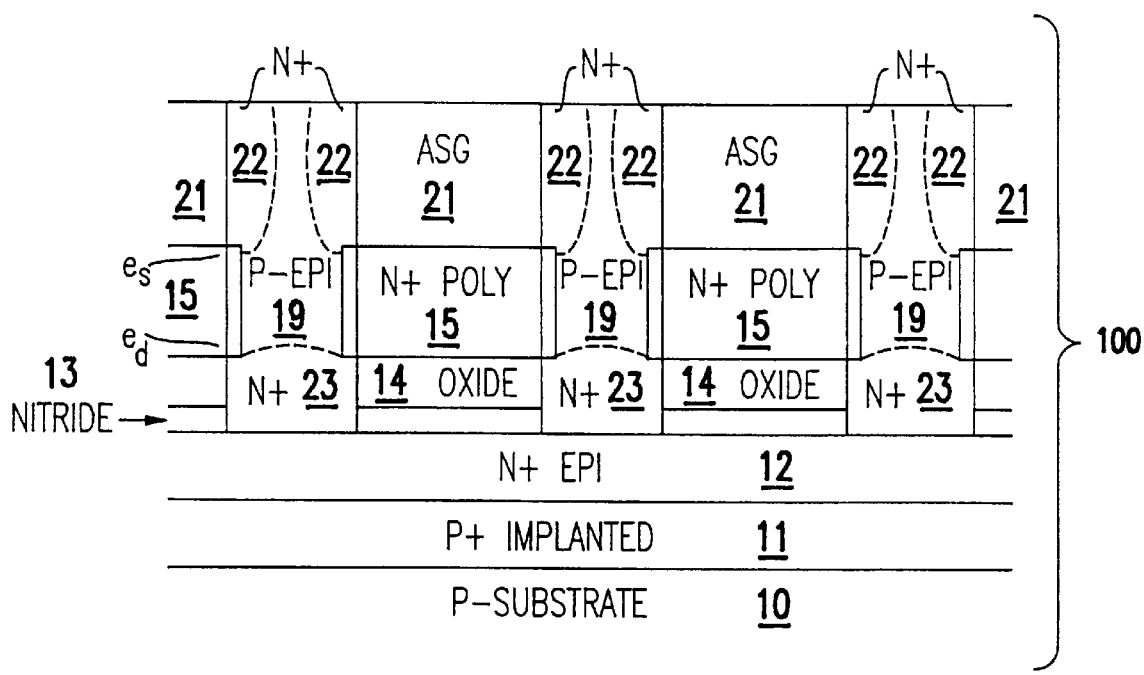
Figure 7:
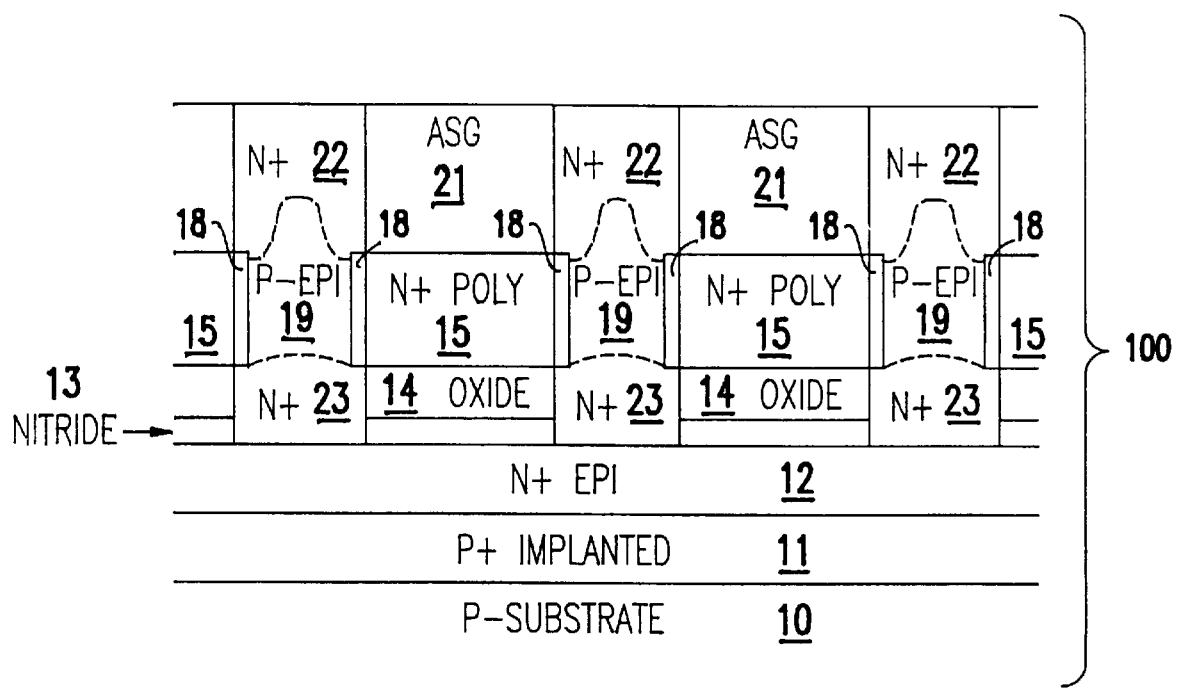

A thermal drive step in an inert ambient atmosphere is then used to laterally diffuse the N+ dopant out of the adjacent ASG 21 to form the source regions 22 in an upper region of the silicon pillars 19, and to vertically diffuse the N+ dopant out of the underlying N+ epi layer 12 to form the drain 23 in a lower region of the silicon pillars 19, which results in the intermediate structure shown in FIG. 6. This thermal step is adjusted by control of temperature and duration to provide the desired degree of overlap of the top edges "$e_s$" of the gate conductor 15 with source regions 22, and the bottom edges "$e_d$" of the gate conductor 15 with drain regions 23. An N+ dopant, such as arsenic, is implanted into the top of the silicon pillars 19 to form heavily doped N+ junctions for the source contacts, as shown in FIG. 7. The final depth of the N+ source regions 22 should not extend significantly past the top edges "$e_s$" of the gate conductor 15.

Alternatively, the thermal drive step may be performed prior to the ASG planarization step. This eliminates the need for the top N+ implant step. In this case the ASG would remain available to later serve as a supplemental N+ dopant source for providing higher concentrations of N+ dopant ions in the top regions of the silicon pillars 19, eliminating the need for the above-described separate N+ top implantation step. Also, the ASG planarization step used to remove the ASG where deposited on top of the silicon pillars during the step of filling of the holes 20 would be postponed until after the thermal drive step.

After forming source regions 22, the ASG 21 is then etched out down to the N+ poly gate conductor 15, such as by etching with BHF (buffered HF acid), which is selective to silicon. Negligible undercutting of the gate oxide 18 in the polysilicon layer 15 beneath the lower corners of the ASG 21 should be encountered since the very thin gate oxide is significantly more dense than the ASG 21. Also, the source diffusion to gate overlap region provides a buffer that can tolerate some undercutting.

Figure 8:
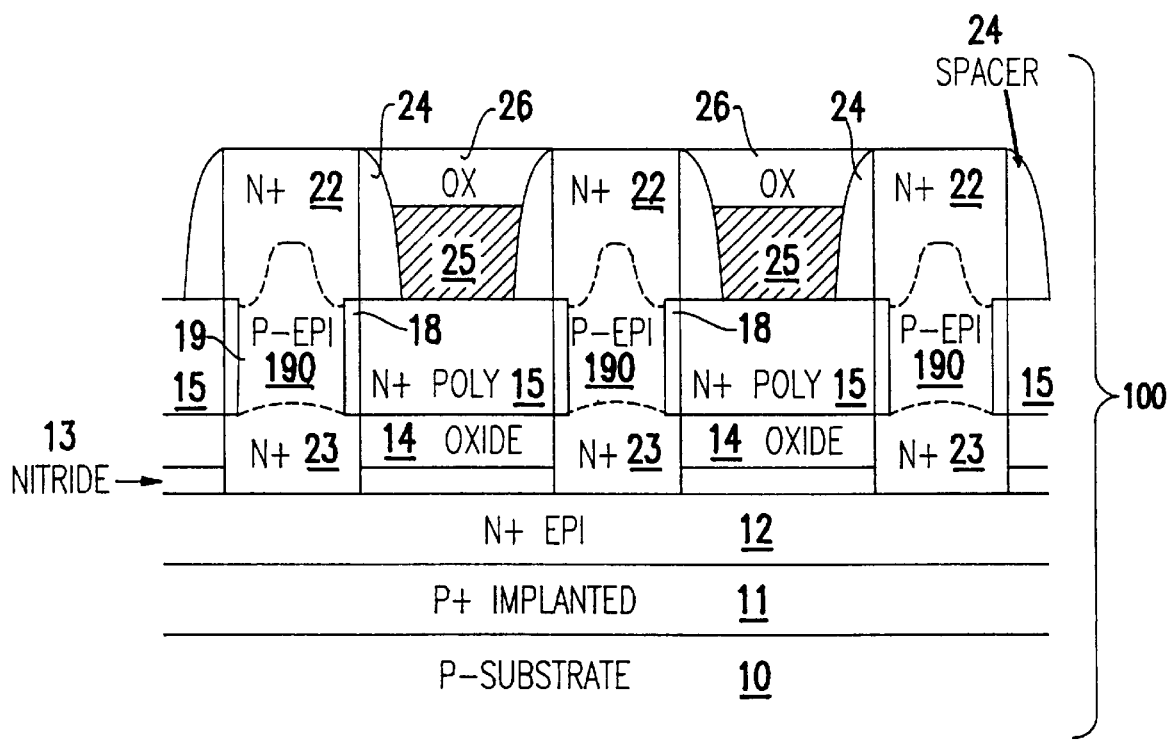

After removal of ASG material 21, insulating spacers 24 (such as oxide or nitride material) are formed in a conventional manner on the exposed sidewalls of the silicon pillars 19 by depositing an insulating material by LPCVD, followed by an anisotropic etch. The space between spacers 24 is filled with a gate metal 25, such as tungsten, which is polished back to the tops of the pillars 19 and spacers 24 and recessed, as shown in FIG. 8. After damascening of the gate metal 25, the recesses located above gate metal 25 and between the spacers 24 are then filled with a dielectric (e.g., oxide) layer 26.

The damascened gate metal 25 bridges the N+ poly gate conductor 15, lowering the total gate resistance. Vias for accessing the gate conductor 15 are later brought out, through the cap oxide 26, between groups of silicon pillars 19. At this stage of the fabrication, as shown in FIG. 8, source regions 22 have been provided laterally adjacent gate metal 25 and the upper dielectric layer 26, drain regions 23 have been provided laterally adjacent the lower dielectric layer 14. In-between the source and drain regions and laterally conductive connection region on said surface of said pillars and second dielectric layer, said first conductive connection region electrically connecting each of said source electrodes to each other adjacent the gate oxide, there is a channel region 190. The channel 190 can be of opposite conductivity to the source regions 22 and drain regions 23. However, if a P+ gate conductor 15 is used and the pillar diameter is sufficiently small the conductivity type of the channel 190 will be the same as the source regions 22 and drain regions 23 to form a depletion type FET. Consequently, each silicon pillar 19 has a source region 22 overlying a channel 190, which, in turn, overlies a drain region 23.

A source metal layer 27 is deposited and patterned for contacting the source diffusion 22 of each conductive pillar 19. Openings in the source metal pattern 27 are provided between groups of pillars 19, for the gate metal vias.

Figure 9:
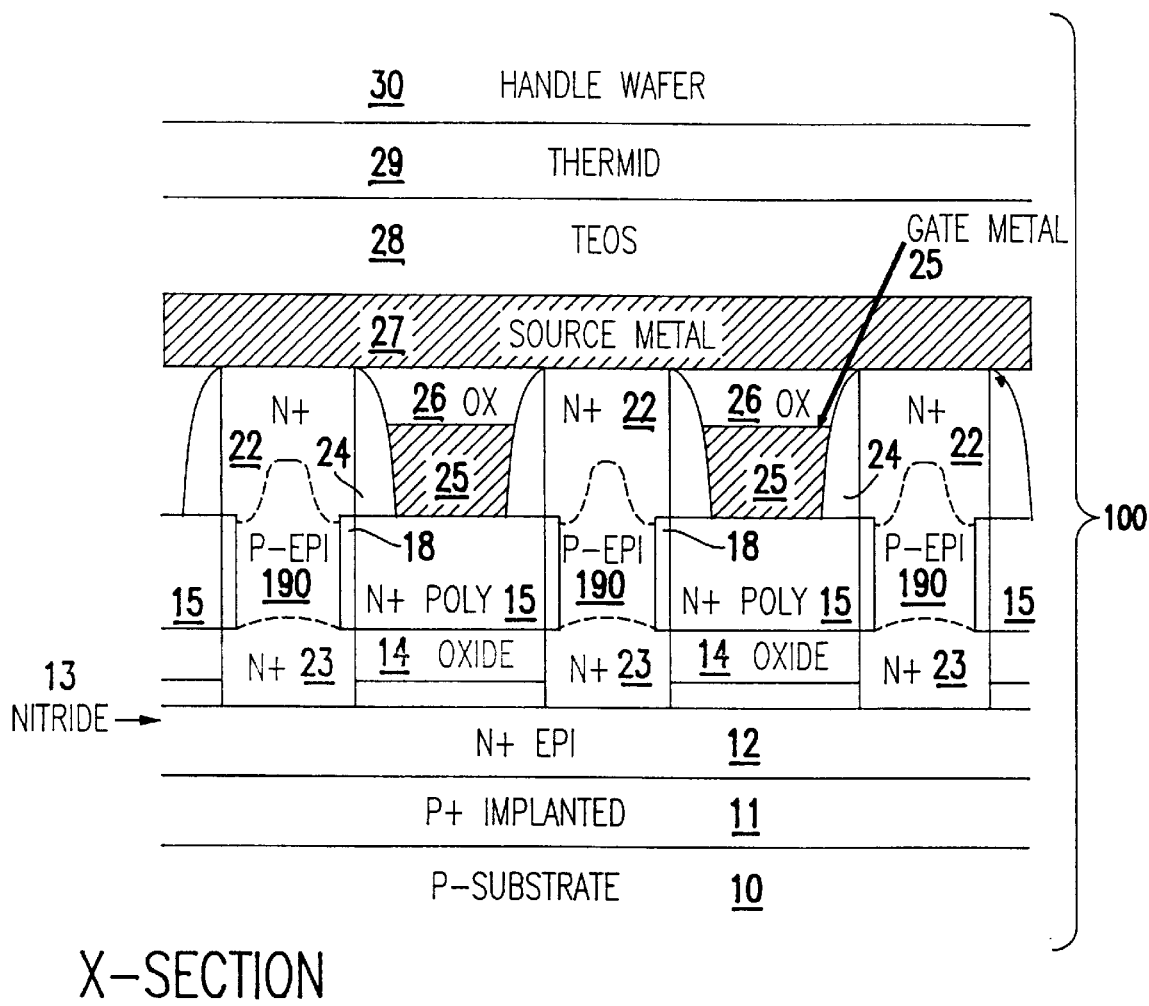
Figure 10:
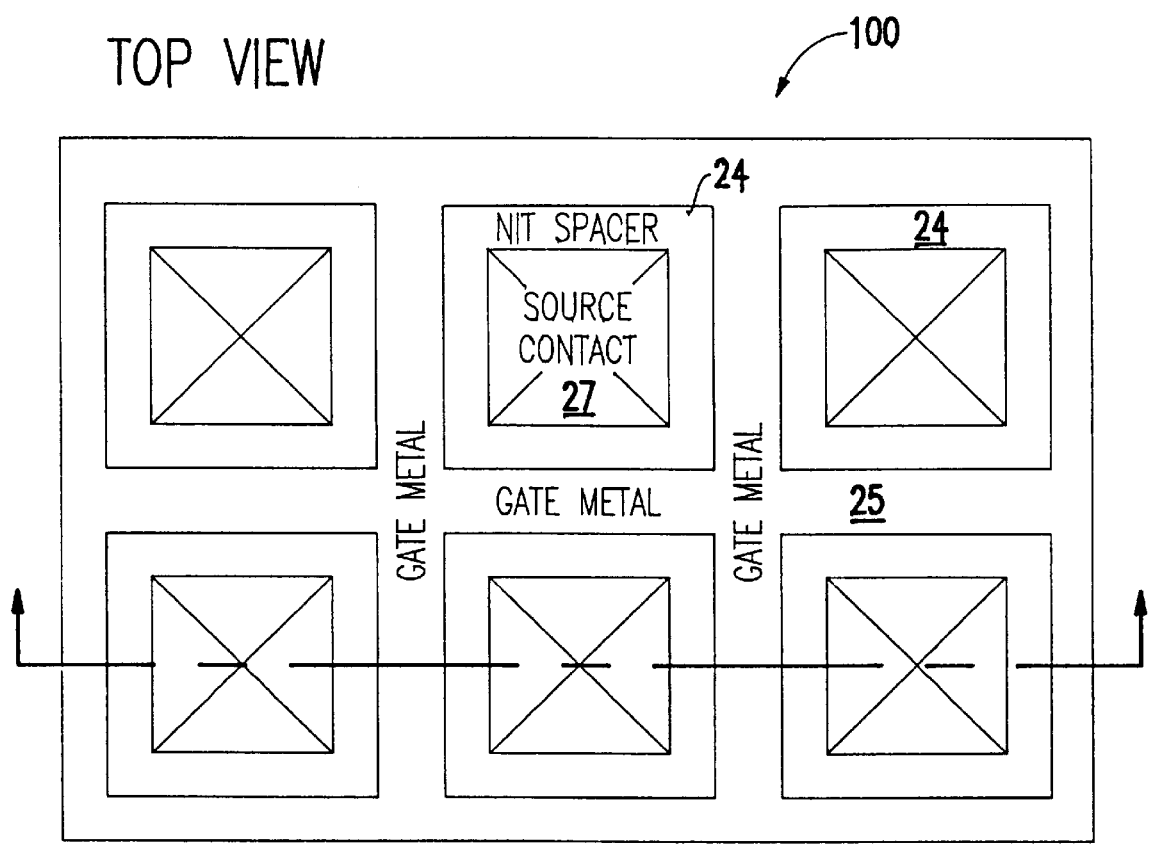
FIG. 10 illustrates an enlarged, top view of the power transistor structure made according to the present invention.

Then, a passivating TEOS layer 28 is deposited over the source metal 27. Then, a handle wafer 30 is then bonded to the TEOS, such as with a layer of polyimide 29. Cross-sectional and top views of the structure at this point in the process are shown in FIG. 9 and FIG. 10, respectively.

A preferred polyimide material for layer 29 is THERMID, which is made of acetylene-terminated isoimide oligomers containing benzophenonetetracarboxylic dianhydride with 1,3-bis (3-amino-phenoxy) benzene backbone units, and THERMID is available from National Starch & Chemical Co.

Next, the wafer is flipped over and the backside is etched and polished down to the N+ epi layer 12, using conventional techniques known in the art for making BE (bond and etchback) silicon-on-insulator (SOI) substrates. To accomplish this, the bulk of the P substrate 10 is ground away and the remainder of P substrate 10 is preferentially etched away to expose P+ layer 11. The P+ layer, in turn, is polished away to expose the N+ layer 12.

Figure 11:
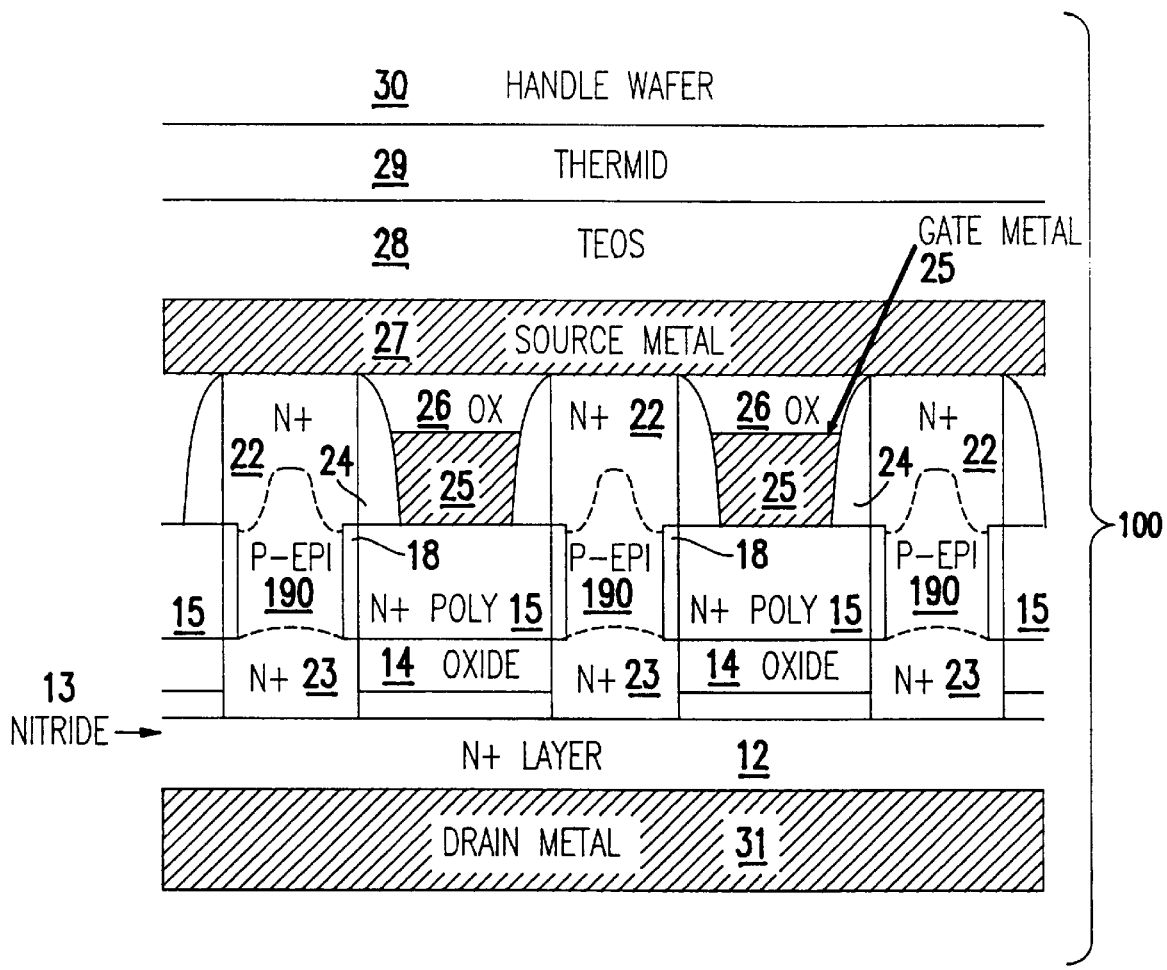

A drain metal 31, such as formed of aluminum or an Al alloy, silicides of W, Ti, or Co, and the like, is deposited as a large continuous plate structure with a thickness of about 500 to 10,000 Å over the exposed surface of the N+ layer 12, as shown in FIG. 11. The drain metal 31 can be formed by conventional methods such as sputtering, vacuum evaporation, or CVD. A much lower drain series resistance and increased heat dissipation capacity is achieved by the provision of a continuous N+ bottom layer (drain) which is strapped by continuous metal layer 31, as compared to a use of a drain diffusion in a P substrate. Standard dicing and packaging can then be performed on the completed device.

While the invention has been described in terms of a specific embodiment, further modifications and improvements will occur to those skilled in the art. For instance, both N-channel and P-channel devices can be manufactured with the inventive process by appropriate management of the doping protocol. Also, a silicon-on-insulator (SOI) having dopant implanted into the top silicon portion of the SOI could be used instead of the above-exemplified P-substrate/P+ implanted/N+epi scheme embodied by layers 10–12. For example, N+ dopant could be implanted into the top silicon portion of a SOI, and nitride 13 could be formed on that surface, and then the fabrication process could proceed from there as described above until the backside thinning step is reached. Backside thinning can then be easily accomplished by grinding away the lower silicon substrate down to the backside oxide, then etching off the oxide portion of the SOI with a conventional technique by selecting an etchant selective to silicon. After etching off the oxide portion of the SOI, the remaining doped top silicon portion of the SOI becomes equivalent to layer 12 as described above and serves as a common connection region for the drain electrodes. The use of a doped SOI in this manner could facilitate the step of backside thinning, with the tradeoff being that SOI may be more costly in terms of current material costs.

It is to be understood, therefore, that this invention is not limited to any particular forms illustrated and that it is intended in the appended claims to cover all modifications that do not depart from the spirit and scope of this invention.

What is claimed is:

1. A method for forming a power transistor having vertical field effect transistors, comprising the steps of:

providing a substrate;

providing a first diffusion layer being of a first conductivity type overlying said substrate;

forming a nitride etch stop layer overlying said first diffusion layer;

forming a first dielectric layer overlying said nitride etch stop layer;

forming a gate conductor layer overlying said first dielectric layer;

forming a cap nitride layer overlying said gate conductor layer;

sequentially removing portions of each of said cap nitride layer, said gate conductor layer, and said first dielectric layer, to form a plurality of openings exposing surface regions of said nitride etch stop layer to form sidewalls in said gate conductor layer, said sidewalls bounding said openings;

forming gate oxide on said sidewalls of said gate conductor layer bounding said openings;

forming a plurality of pillars of said first or a second conductivity type, wherein each pillar fills one of said openings and has an exposed pillar surface planar with or extending above said cap nitride layer;

removing said cap nitride layer to form holes laterally bounded by said pillars;

filling said holes with a doped material providing a second diffusion layer of said first conductivity type;

forming (i) drain electrodes of said first conductivity types in said pillars at locations laterally adjacent said first dielectric layer and overlying said first diffusion layer and (ii) source electrodes of said first conductivity type in said pillars at locations laterally adjacent said second diffusion layer, whereby a channel of first or second conductivity type is located in each said pillar between said drain and source electrodes and laterally adjacent said gate oxide on said sidewalls of said gate conductor layer.

2. The method of claim 1, wherein said first conductivity type is N type and said second conductivity type is P type.

3. The method of claim 1, wherein said first conductivity type is P type and said second conductivity type is N type.

4. The method of claim 1, wherein said openings have vertical or substantially vertical side walls.

5. The method of claim 1, wherein said gate conductor layer is polysilicon.

6. The method of claim 1, wherein said step of forming said pillars of said second conductivity type comprises epitaxially growing a semiconductor material with in-situ doping during growth.

7. The method of claim 1, wherein said material providing a second diffusion layer of said first conductivity type is ASG.

8. The method of claim 1, further comprising the steps of removing said second diffusion layer to expose laterally adjacent sidewalls of said pillars and the upper surface of said gate conductor layer;

forming sidewall insulating spacers on said exposed laterally adjacent sidewalls of said pillars;

forming gate metal on said upper surface of said gate conductor layer; and forming a second dielectric layer overlying said gate metal, said second dielectric layer provided with a surface planar with said surface of said pillars.

9. The method of claim 8, further comprising the step of:

forming a first conductive connection region on said surface of said pillars and second dielectric layer, said first conductive connection region electrically connecting each of said source electrodes to each other, wherein said first diffusion layer electrically connects each of said drain electrodes to each other.

10. The method of claim 9, further comprising the step of:

forming a heavily doped sub-region of said second conductivity type in a surface of said substrate before said formation of the first diffusion layer, said first diffusion layer overlying said heavily doped sub-region.

11. The method of claim 10, further comprising the step of:

removing said substrate and said heavily doped sub-region of said substrate to expose a surface of said first diffusion layer; and forming a second conductive connection region on said exposed surface of said first diffusion layer.

12. The method of claim 1, wherein said steps of providing said substrate and said first diffusion layer comprises providing an silicon-on-insulator structure (SOI), wherein dopant of said first conductivity type is implanted into a silicon portion of said SOI.

13. The method of claim 11, further comprising the step of:

forming spacers on sidewalls of said cap nitride layer bounding said plurality of openings after said substep of removing portions of said cap nitride layer and before said substep of removing portions of said gate conductor layer.

14. A power transistor having vertical field effect transistors, comprising:

a first diffusion layer of a first conductivity type;

a first dielectric layer overlying said first diffusion layer;

a gate conductor overlying said first dielectric layer;

a gate metal and a second dielectric layer, in that sequence, overlying said gate conductor;

openings extending vertically through said gate metal, said second dielectric layer, said gate conductor material, and said first dielectric layer, wherein said openings stop on said first diffusion layer, and wherein said gate conductor has lateral sidewalls bounding said openings;

a gate oxide on said sidewalls of said gate conductor;

a plurality of pillars of said first or a second conductivity type, wherein said pillars comprise a doped semiconductor material filling each of said openings to a height planar with said second dielectric layer; and drain electrodes of said first conductivity type in said pillars at locations laterally adjacent said first dielectric layer and overlying said first diffusion layer, and source electrodes of said first conductivity type in said pillars at locations laterally adjacent said gate metal and said second dielectric layer, whereby a channel of said first or second conductivity type is located in each said pillar between said drain and source electrodes and laterally adjacent said gate oxide on said sidewalls of said gate conductor layer.

15. The power transistor of claim 14, wherein said first conductivity type is N type and said second conductivity type is P type.

16. The power transistor of claim 14, wherein said first conductivity type is P type and said second conductivity type is N type.

17. The power transistor of claim 14, wherein said pillars have vertical or substantially vertical side walls.

18. The power transistor of claim 14, wherein said gate conductor layer is polysilicon.

19. The power transistor of claim 14, wherein said first diffusion layer of said first conductivity type electrically connects each of said drain electrodes to each other.

20. The power transistor of claim 14, further comprising a conductive connection region on said pillars and said second dielectric layer which electrically connects each of said source electrodes to each other.

* * * * *